US012599022B2

(12) United States Patent　　　　(10) Patent No.: US 12,599,022 B2
Ding et al.　　　　　　　　　　　　(45) Date of Patent: Apr. 7, 2026

(54) APPARATUS FOR APPLYING A SINTERING FORCE VIA A COMPRESSIBLE FILM

(71) Applicant: ASMPT SINGAPORE PTE. LTD., Singapore (SG)

(72) Inventors: Jiapei Ding, Singapore (SG); Teng Hock Kuah, Singapore (SG); Bin Yuan, Singapore (SG); Yi Lin, Singapore (SG); Jian Liao, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 796 days.

(21) Appl. No.: 17/871,496

(22) Filed: Jul. 22, 2022

(65) Prior Publication Data

US 2024/0030181 A1　　Jan. 25, 2024

(51) Int. Cl.
H01L 23/00　　　(2006.01)
(52) U.S. Cl.
CPC .............. H01L 24/83 (2013.01); H01L 24/75 (2013.01); *H01L 2224/7555* (2013.01); *H01L 2224/83201* (2013.01); *H01L 2224/8384* (2013.01)
(58) Field of Classification Search
CPC ......... H01L 21/67098; H01L 21/67121; H01L 2224/7555; H01L 2224/83201; H01L 2224/8384; H01L 24/75; H01L 24/83
See application file for complete search history.

(56) References Cited

U.S. PATENT DOCUMENTS

| | | | | |
|---|---|---|---|---|
| 7,857,028 B2 | 12/2010 | Kanisawa | ................... | 156/583.3 |
| 9,659,793 B2 * | 5/2017 | Heuck | ................. | H01L 21/4825 |
| 10,679,770 B1 * | 6/2020 | Brandenburg | ....... | B23K 1/0016 |
| 11,535,017 B2 | 12/2022 | Doernhoefer et al. | | |
| 2008/0035274 A1 | 2/2008 | Kanisawa | ................... | 156/583.1 |
| 2016/0148819 A1 | 5/2016 | Heuck et al. | | |
| 2017/0144246 A1 * | 5/2017 | Bogen | ..................... | H01L 24/75 |
| 2018/0040593 A1 * | 2/2018 | Zhou | ....................... | H01L 24/09 |
| 2018/0061744 A1 * | 3/2018 | Railkar | .............. | H01L 21/4853 |

(Continued)

FOREIGN PATENT DOCUMENTS

| | | | | | |
|---|---|---|---|---|---|
| CN | 112789150 A | * | 5/2021 | .......... | B23K 20/023 |
| DE | 102013104572 A1 | * | 11/2014 | .............. | H01L 24/11 |

(Continued)

OTHER PUBLICATIONS

Extended European Search Report dated Dec. 8, 2023 issued in corresponding European Application No. 23183577.8.

(Continued)

*Primary Examiner* — Telly D Green
(74) *Attorney, Agent, or Firm* — OSTROLENK FABER LLP

(57) ABSTRACT
A sintering apparatus for simultaneously sintering an electronic device onto a substrate, and a metallic sheet onto the electronic device includes a sinter tool and a compressible film positionable onto the metallic sheet and the electronic device. A thickness of the compressible film is greater than a height of the metallic sheet. The compressible film is adapted to conform to a shape of the metallic sheet and the electronic device to simultaneously cover the metallic sheet and at least a part of the electronic device when the sinter tool applies a sintering force onto the compressible film during a sintering process.

12 Claims, 8 Drawing Sheets

(56)     References Cited

U.S. PATENT DOCUMENTS

2019/0006193  A1     1/2019  Wedi et al.
2019/0006265  A1     1/2019  Yamada et al.
2021/0035886  A1     2/2021  Islam et al.
2021/0121962  A1 *   4/2021  Birkicht .................. H01L 24/29

FOREIGN PATENT DOCUMENTS

KR     10-2019-0137134  A     12/2019
WO     WO-2004010752  A1 *   1/2004   ........... B23K 20/021
WO     WO-2006082744  A1 *   8/2006   ........... B30B 15/024
WO     WO-2009068010  A1 *   6/2009   ......... H01L 23/3164

OTHER PUBLICATIONS

Notice of Preliminary Rejection mailed Jul. 10, 2024 issued in
corresponding Korean Patent Application No. 10-2023-0090983
with its English translation.

* cited by examiner

APPARATUS FOR APPLYING A SINTERING FORCE VIA A COMPRESSIBLE FILM

FIELD OF THE INVENTION

The invention relates to the sintering of electronic devices, such as during the manufacture of sintered packages including high power electronics devices.

BACKGROUND AND PRIOR ART

Sintering is the process of compacting and forming a solid mass of material by heat and/or pressure without melting it to the point of liquefaction. The atoms in the materials diffuse across the boundaries of the particles, fusing the particles together and creating one solid piece. It is commonly employed for attaching semiconductor dies in high power electronics devices where sinter materials replace solder in high-temperature applications.

Current sintering systems and solutions for stacked power structures involve a two-step sintering process. During a first step, a power semiconductor die is sintered onto a substrate. During a second step, a thin metallic sheet is thereafter sintered onto the power semiconductor die. The metallic sheet may be in the form of a foil made of copper, silver, gold, nickel or other metal, or may comprise an alloy. The metallic sheet may also include a plated layer, such as a silver layer that is plated onto a copper foil. An example of such a thin metallic sheet is a so-called die top system ("OTS"). The metallic sheet provides die protection to enable copper wire bonding with high yield, and it may include pre-applied sinter paste and adhesives to simplify its assembly onto a semiconductor die.

FIG. 1 is a plan view of a substrate 100 on which multiple semiconductor chips or dies 102 and metallic sheets 104 have been mounted. The substrate 100 may be a direct bond copper (DBC) ceramic substrate. There are usually multiple semiconductor dies 102 mounted on a single DBC substrate 100 to be sintered, and there may be height variations between the various semiconductor dies 102.

FIG. 2A is a side view of a prior art sintering approach using an incompressible film 108 separating a sinter tool 110 and a semiconductor die 102. The incompressible film 108 is used as a cushion in order to improve pressure homogeneity. Such an incompressible film 108 has a volume which remains constant when a force is applied to deform it. As such, its material is usually pushed aside by the deformation force to establish a volume-preserving state of the incompressible film 108. The semiconductor die 102 has been placed onto a layer of sinter paste 106 on the substrate 100. The solidified sinter paste 106 would adhere the semiconductor die 102 to the substrate 100 after sintering.

FIG. 2B shows a sintering force 112 being applied on the semiconductor die 102 via the incompressible film 108. After the semiconductor die 102 has been bonded onto the sinter paste 106 and substrate 100, the sinter tool 110 and incompressible film 108 are moved away from the semiconductor die 102.

Thereafter, FIG. 2C shows a metallic sheet 104 that is placed on top of the semiconductor die 102 which has been bonded to the substrate 100, after the sinter tool 110 and incompressible film 108 have been moved away from the semiconductor die 102. A layer of sinter paste 106 is present between the metallic sheet 104 and the semiconductor die 102 in order to bond the metallic sheet 104 to the semiconductor die 102.

FIG. 2D shows the sinter tool 110 applying a sintering force 112, this time on the metallic sheet 104, via the incompressible film 108. After the sinter paste 106 hardens, the metallic sheet 104 would be successfully bonded onto the semiconductor die 102.

There are several shortcomings with the current two-step sintering process, which relies on an incompressible film 108 such as normal incompressible PTFE (polytetrafluoro-ethylene) film to transmit the sintering force 112. First, the die top metallization may be contaminated by the PTFE film which is in direct contact with the semiconductor die top during the first sintering step, and a proprietary cleaning process is required to clean or reactivate the semiconductor die top metallization for sintering the metallic sheet. This will prolong the assembly time and increase operation cost and complexity.

Moreover, a typical thickness of such an incompressible film, such as PTFE film is 0.05 mm. This thickness would usually not be enough to cover the height variations of semiconductor dies 102 or metallic sheets 104, since PTFE film with a thickness of 0.05 mm can typically cover height variations of only up to around 0.01 mm. On the other hand, the actual variations of semiconductor dies 102 or metallic sheets 104 may be as much as 0.05 mm. In case such height variation is not completely compensated, then the bond quality of the sintered semiconductor dies 102 or metallic sheets 104 will be adversely affected.

Incompressible material in the form of elastomers such as silicone rubber may also be used as a pressure pad when it is adhered to a top sintering tool in order to compensate for any variations in thickness in the product. However, the elastomer itself is a solid material, and therefore the pressure distribution inside the pressure pad is intrinsically non-uniform. This non-uniformity will risk causing yield or damage issues since the lower pressure area is prone to having low die bond strength and the high pressure area has a high risk of semiconductor die crack.

Furthermore, the use of elastomers as pressure pads does not allow the ability to choose the areas or components to be pressure sintered. Since such selection is not possible, this concept is likely to introduce damage to the substrate, such as cracks or breakage during sintering, especially if the substrate is a panel-type ceramic substrate.

It would be beneficial to provide a one-step sintering process for the metallic sheet and power semiconductor die, which avoids the aforesaid shortcomings of current sintering approaches, such as the inability to selectively apply sintering pressure onto predetermined areas.

SUMMARY OF THE INVENTION

It is thus an object of the invention to seek to provide an effective one-step sintering process by deploying a compressible material as a force distribution medium during sintering.

According to a first aspect of the invention, there is provided a sintering apparatus for simultaneously sintering an electronic device onto a substrate, and a metallic sheet onto the electronic device, the sintering apparatus comprising: a sinter tool; and a compressible film positionable onto the metallic sheet and the electronic device: wherein a thickness of the compressible film is greater than a height of the metallic sheet, and the compressible film is adapted to conform to a shape of the metallic sheet and the electronic device to simultaneously cover the metallic sheet and at least a part of the electronic device when the sinter tool applies a sintering force onto the compressible film during a sintering process.

According to a second aspect of the invention, there is provided a method for simultaneously sintering an electronic device onto a substrate, and a metallic sheet onto the electronic device, the method comprising the steps of: placing the electronic device onto the substrate and a metallic sheet onto the electronic device; placing a compressible film onto the metallic sheet and the electronic device, wherein a thickness of the compressible film is greater than a height of the metallic sheet; and thereafter with a sinter tool, applying a sintering force onto the compressible film during a sintering process, such that the compressible film conforms to a shape of the metallic sheet and the electronic device to simultaneously cover the metallic sheet and at least a part of the electronic device with the compressible film.

According to a third aspect of the invention, there is provided a method for manufacturing a sintered package by simultaneously sintering an electronic device onto a substrate, and a metallic sheet onto the electronic device, the method comprising the steps of: placing the electronic device onto the substrate and a metallic sheet onto the electronic device; placing a compressible film onto the metallic sheet and the electronic device, wherein a thickness of the compressible film is greater than a height of the metallic sheet; and thereafter with a sinter tool, applying a sintering force onto the compressible film during a sintering process, such that the compressible film conforms to a shape of the metallic sheet and the electronic device to simultaneously cover the metallic sheet and at least a part of the electronic device with the compressible film.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary sintering process in accordance with the invention will now be described with reference to the accompanying drawings, in which.

DETAILED DESCRIPTION OF THE PREFERRED EMBODIMENT OF THE INVENTION

Figure 1:
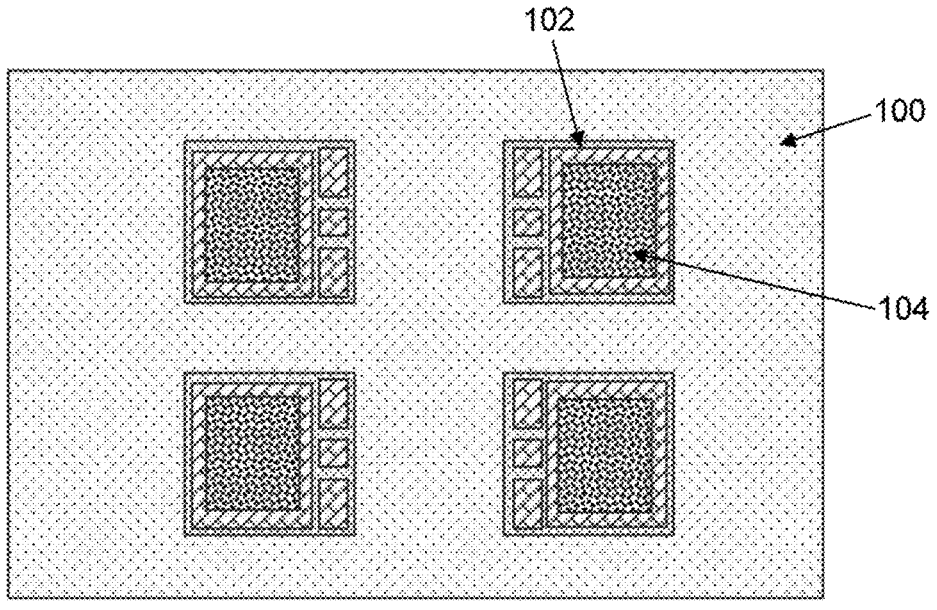
FIG. 1 is a plan view of a substrate on which multiple semiconductor dies and metallic sheets have been mounted.
Figures 2A, 2B:
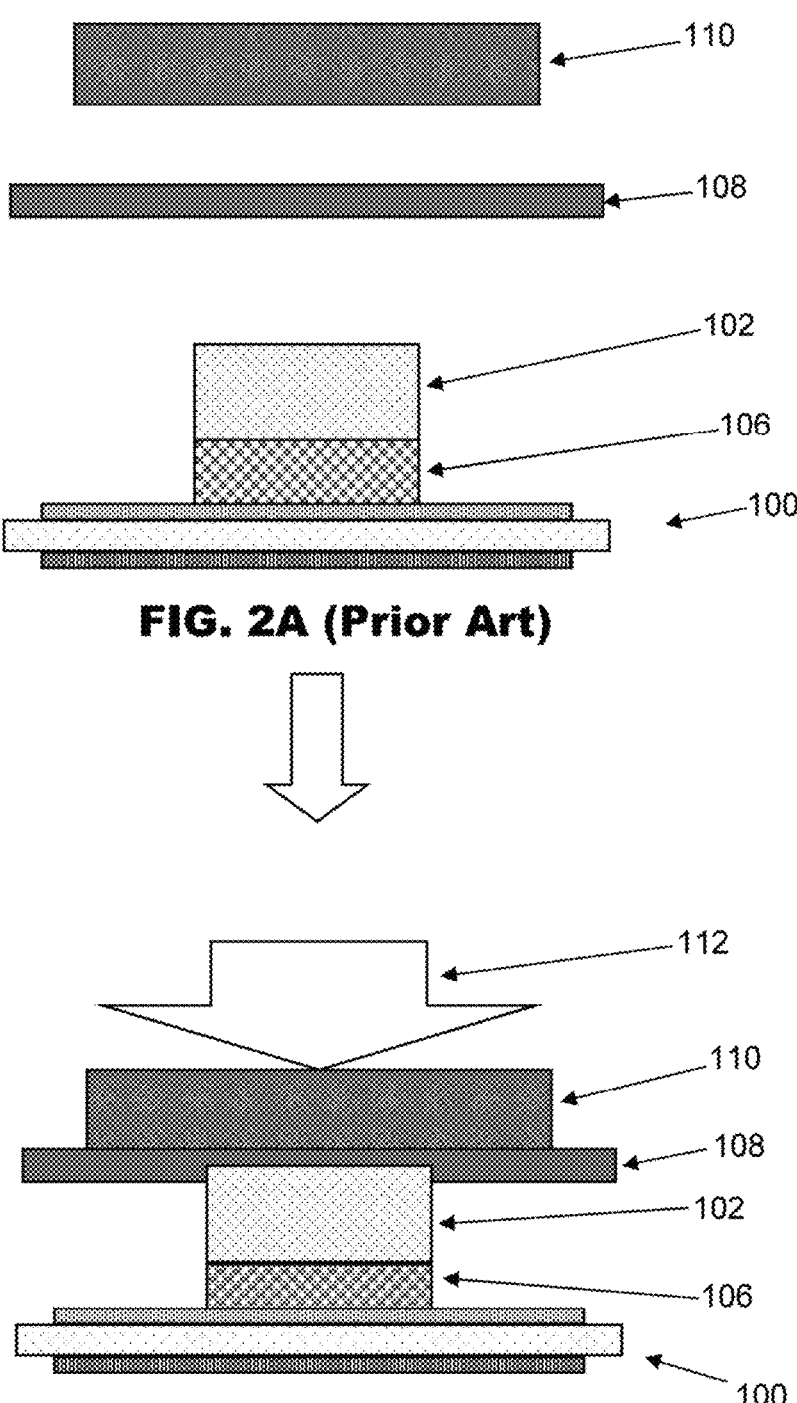
FIG. 2A is a side view of a prior art sintering approach using an incompressible film separating a sinter tool and a semiconductor die.
FIG. 2B shows a sintering force applied on the semiconductor die via the incompressible film.
Figures 2C, 2D:
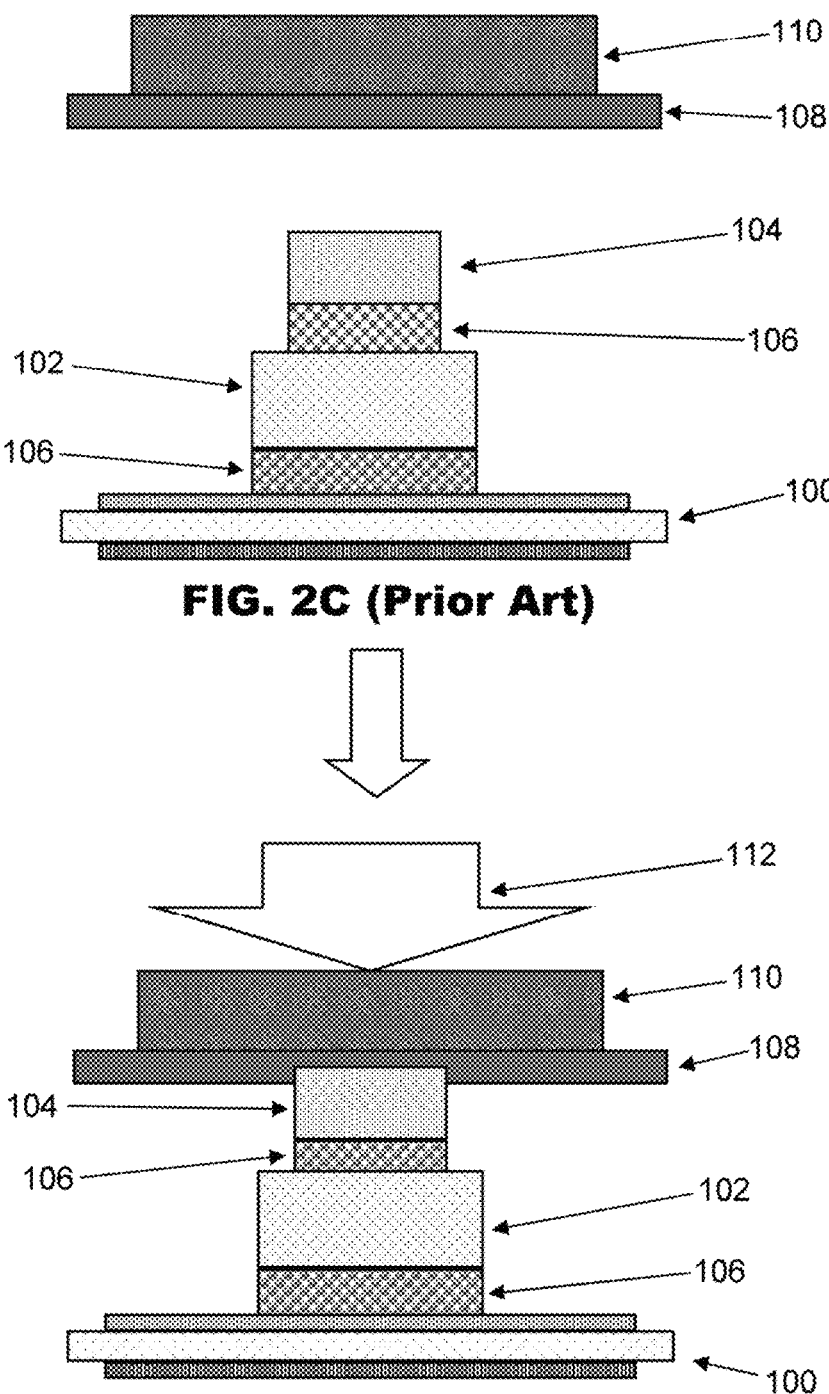
FIG. 2C shows a metallic sheet placed on top of the semiconductor die.
FIG. 2D shows the sinter tool applying a sintering force on the metallic sheet via the incompressible film.
Figure 3A:
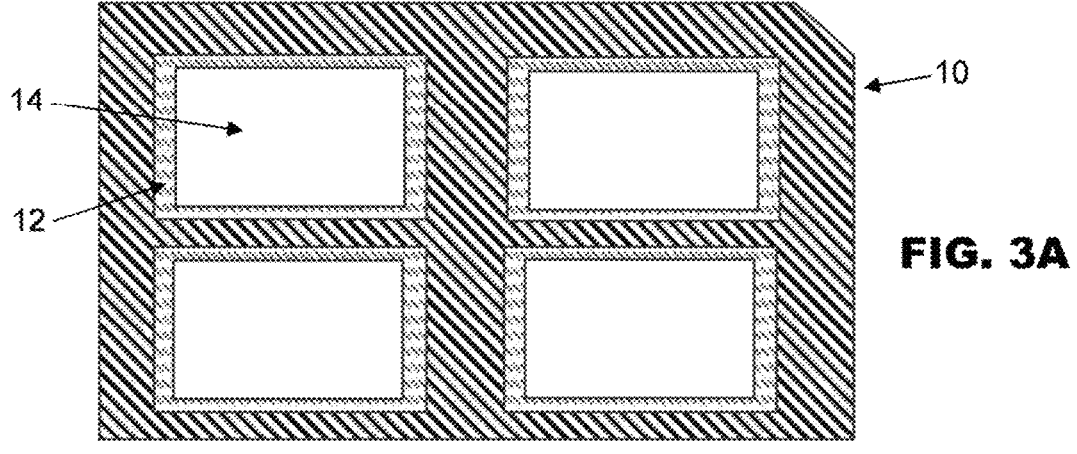
FIG. 3A is a plan view of a carrier.

For the purpose of illustrating how multiple electronic devices (such as semiconductor dies 18) and metallic sheets 20 are bonded onto a substrate 16 by sintering in a sintering apparatus, FIG. 3A is a plan view of a carrier 10 used for supporting a plurality of substrates 16 during sintering in accordance with the preferred embodiment of the current invention. The carrier 10 is adapted to be received by the sintering apparatus when it is supporting at least one substrate 16 for sintering. The illustrated carrier 10 has a plurality of pockets 12 including through-holes, each pocket 12 being configured to carry one substrate 16. A perimeter of each pocket 12 incorporates a step 14, onto which edges of the substrate 16 may rest and be supported.

Figure 3B:
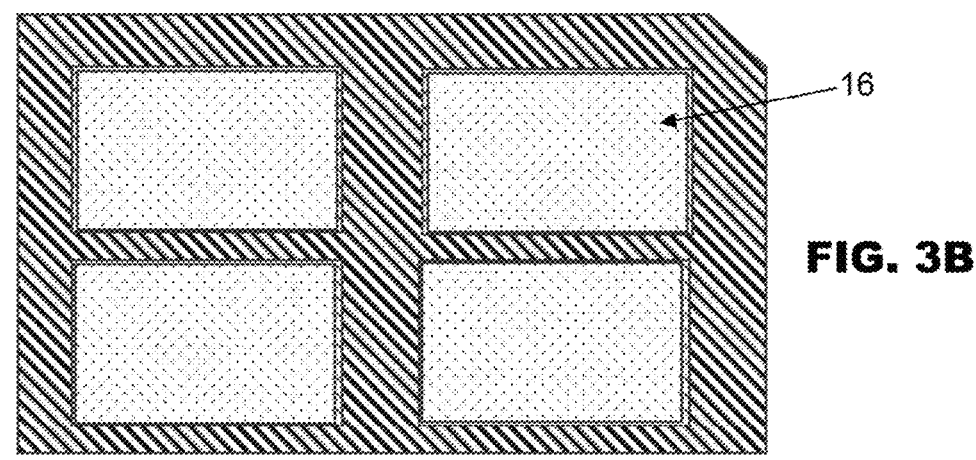
FIG. 3B shows substrates placed onto the carrier.
Figure 3C:
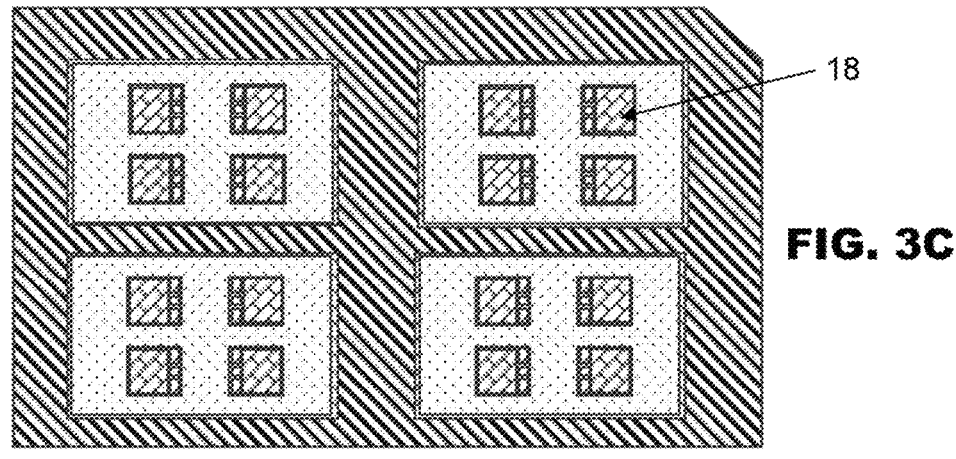
FIG. 3C shows semiconductor dies placed onto the substrates.

FIG. 3B shows four substrates 16 having been placed onto the carrier 10, each of the substrates being supported by the step 14 in a respective pocket 12. In FIG. 3C, multiple semiconductor dies 18 have placed onto the substrate 16. In this illustration, each substrate 16 is configured to hold four semiconductor dies 18. Each semiconductor die 18 should be placed onto a layer of sinter paste 24 in preparation for the sintering process to follow.

Figure 3D:
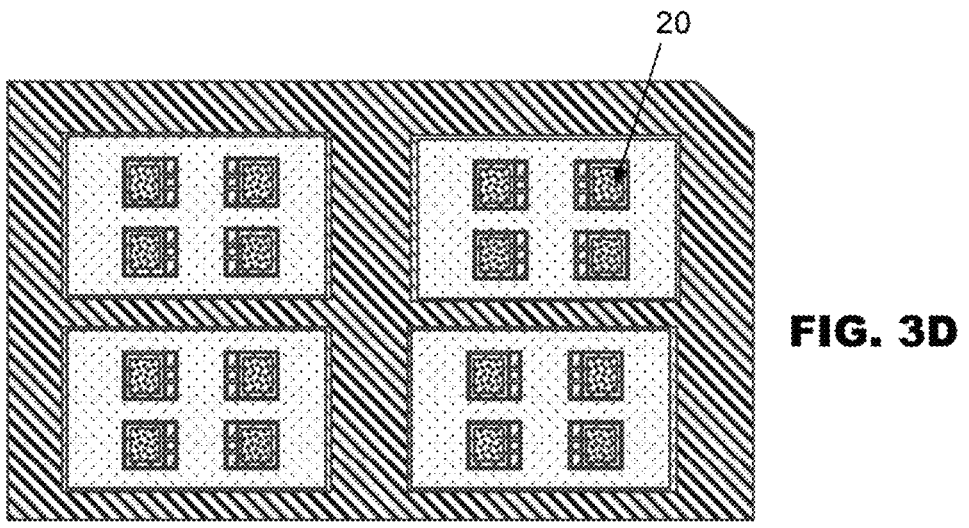
FIG. 3D shows multiple metallic sheets placed onto the semiconductor dies.
Figure 3E:
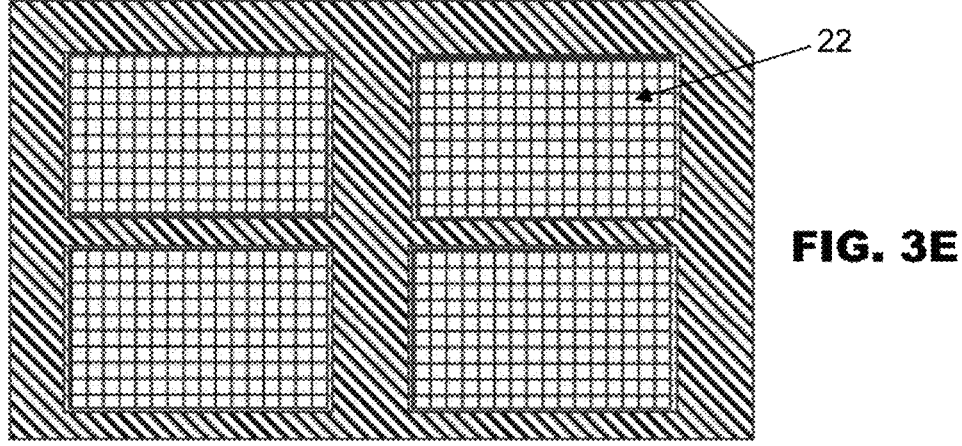
FIG. 3E shows pieces of compressible film placed onto the substrates.

FIG. 3D shows multiple metallic sheets 20 that have been placed onto the semiconductor dies 18, each semiconductor die 18 being configured to hold one metallic sheet 20. Each metallic sheet 20 may have a layer of sinter paste 24 on its surface when it is located on a semiconductor die 18 in preparation for the sintering process. Finally, FIG. 3E shows four pieces of compressible film 22 that are placed onto the substrates 16, the multiple pieces of compressible film 22 fitting a space allocated by the carrier 10 for covering the metallic sheets 20 and semiconductor dies 18 prior to conducting a sintering process.

Unlike incompressible film 108, a volume of the compressible film 22 is specifically configured to change when a deformation force is applied onto its compressible material. These four pieces of compressible film 22 may be placed onto the substrates 16 at a compressible film input station using a pick-and-place operation, and will serve to transmit a compression force onto the metallic sheets 20 and semiconductor dies 18 when a sintering force is applied onto them during the sintering process.

Figure 4A:
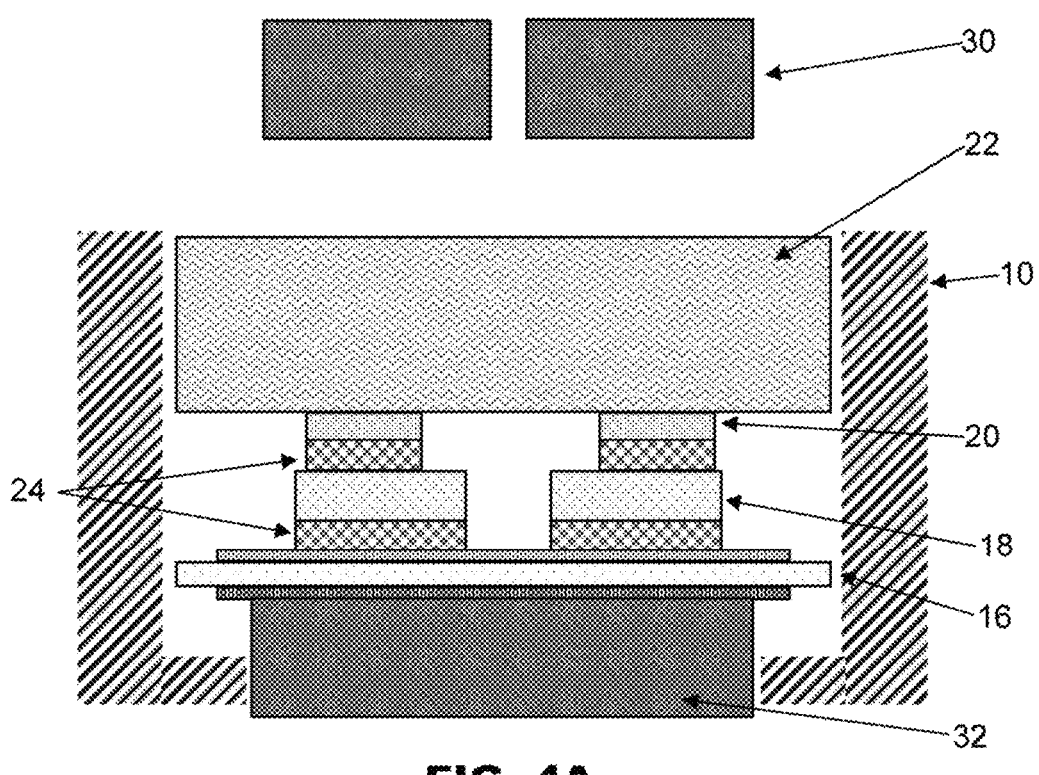
FIG. 4A is a side view of a sintering apparatus including the compressible film in accordance with the preferred embodiment of the invention.

FIG. 4A is a side view of a sintering apparatus including the compressible film 22 in accordance with the preferred embodiment of the invention. In this side view, a pair of semiconductor dies 18 and metallic sheets 20 can be seen. The substrate 16 has been located in a pocket 12 of the carrier 10, and a bottom sinter tool 32 which is insertable and protrudes through the through-hole of the pocket 12 lifts the substrate 16 away from the step 14 in the pocket 12. The bottom sinter tool 32 provides firm support for the substrate 16 during sintering.

The semiconductor dies 18 have been placed onto a layer of sinter paste 24 each on the substrate 16, and the metallic sheets 20 have in turn been placed onto a layer of sinter paste each on the semiconductor dies 18. The compressible film 22 fits into the pocket 12 of the carrier 10 and covers top surfaces of the metallic sheets 20. A top sinter tool 30 is located at a standby position over the compressible film 22, at vertical positions corresponding to the positions of the semiconductor dies 18 and metallic sheets 20.

Figure 4B:
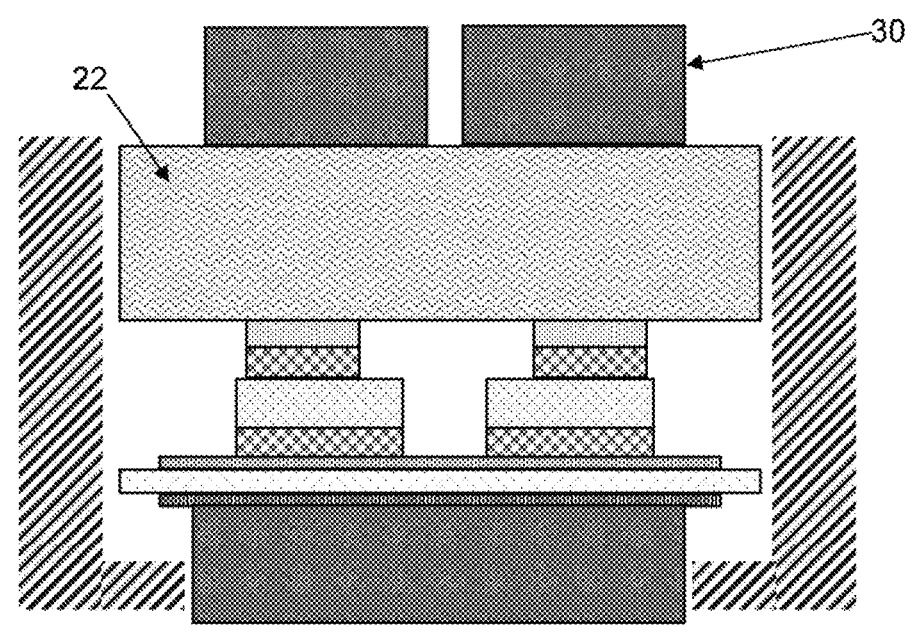
FIG. 4B shows the sinter tool contacting the compressible film.
Figure 4C:
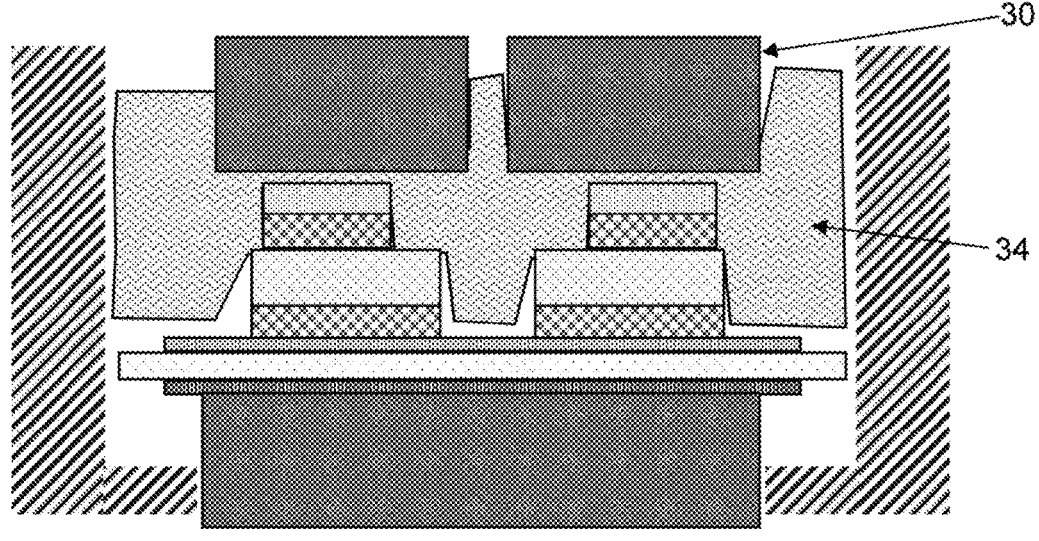
FIG. 4C shows the compressible film being compressed to cover the metallic sheet and part of the semiconductor dies.

FIG. 4B shows the top sinter tool 30 contacting the compressible film 22, but the compressible film 22 has not been compressed yet. FIG. 4C shows the compressible film 22 being compressed by the top sinter tool 30 to produce a depressed compressible film 34 that is starting to form a compliant surface area as it is compressed towards the substrate 16. Due to the thickness of the compressible film 22 being greater than a height of the metallic sheet 20 so that the compressible film 22 is thicker than a thickness of the metallic sheet 20 (including the layer of sinter paste 24 on which the metallic sheet is resting), the compressible film 22 is able to cover an entire exposed area of the metallic sheets 20, as well as part of the semiconductor dies 18 since it is adapted to conform to a shape of the metallic sheets 20 and semiconductor dies 18. If possible, the compressible film 22 may also be selected with such a thickness as to cover an entire exposed area of the semiconductor dies 18 as well as the metallic sheets 20.

Figure 4D:
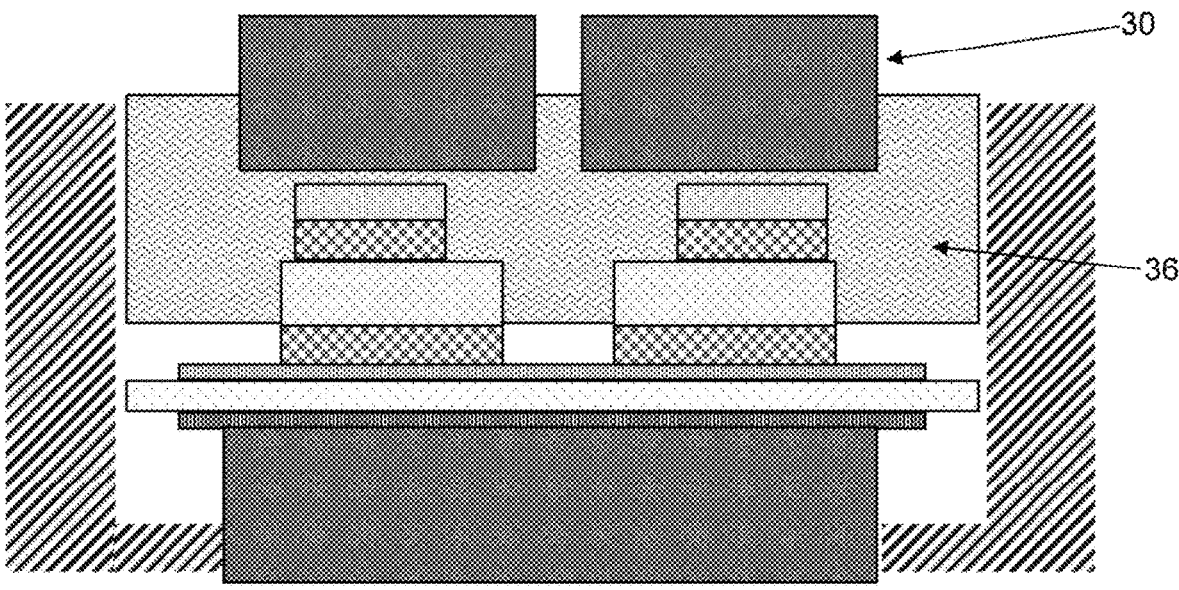
FIG. 4D shows the sintering apparatus at a sintering position wherein the compressible film substantially conforms to the shapes of the metallic sheets and semiconductor dies.

FIG. 4D shows the sintering apparatus at a sintering position wherein the compressible film 22 substantially conforms to the shapes of the metallic sheets 20 and semiconductor dies 18. This conforming compressible film 36 which covers the metallic sheets 20 and semiconductor dies 18 during sintering conforms at its base to surfaces of the metallic sheets 20, sinter paste 24 between the metallic sheets 20 and semiconductor dies 18 and some of the top and side surfaces of the semiconductor dies 18. Accordingly, the conforming compressible film 36 is able to simultaneously cover the metallic sheets 20 and at least a part of the semiconductor dies 18 when the top sinter tool 30 applies a sintering force onto the compressible film 22 during the sintering process.

At its top, the conforming compressible film 36 conforms to and covers a bottom surface and parts of sidewalls of the top sinter tool 30 when the top sinter tool 30 is applying a sintering force onto the conforming compressible film 36. At this point, sintering may be conducted to bond the semiconductor dies 18 to the substrate 16 and the metallic sheets 20 to the semiconductor dies 18 in a one-step process.

Figure 5:
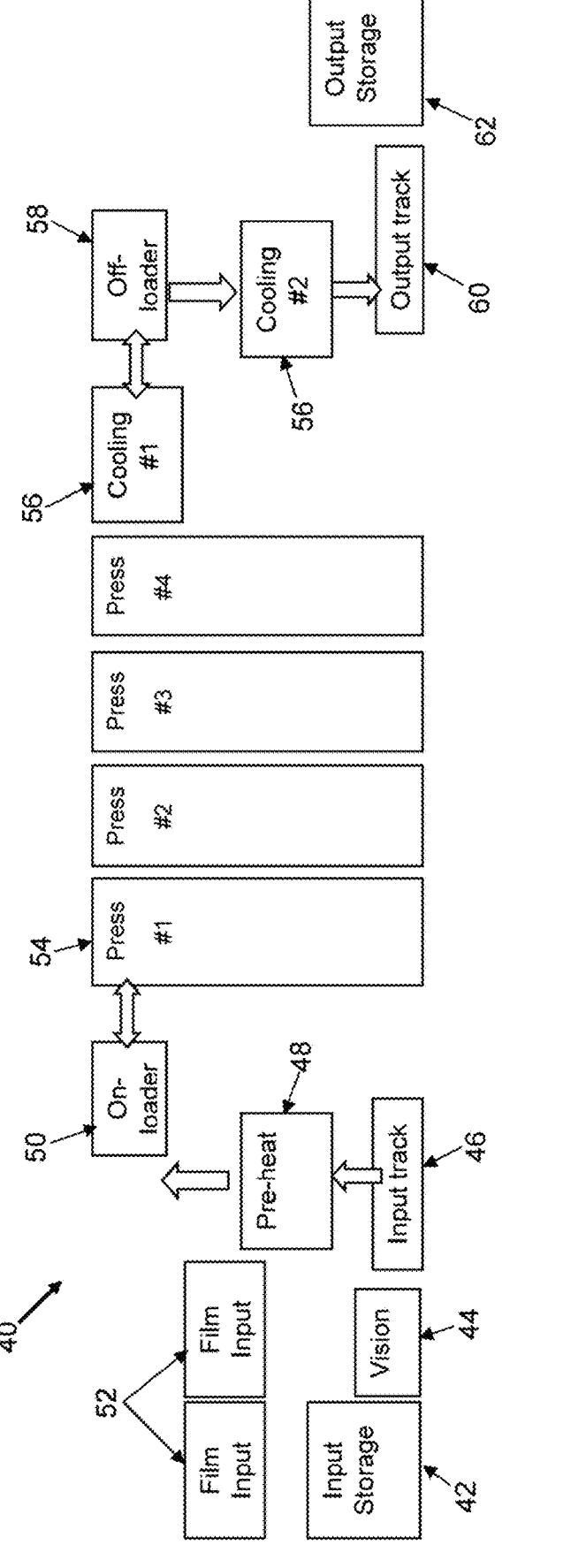
FIG. 5 is a schematic illustration of the modules that may be included in a sintering machine for conducting the sintering process in accordance with the preferred embodiment of the invention.

FIG. 5 is a schematic illustration of the modules that may be included in a sintering machine 40 for conducting the sintering process in accordance with the preferred embodiment of the invention. The sintering machine has a product input storage 42 where carriers 10 carrying substrates 16, semiconductor dies 18 and metallic sheets are introduced and fed into the sintering machine 40. An input vision system 44 checks the carriers 10 and their contents to ensure that there are no defects.

Thereafter, the carriers 10 are fed to a preheat station 48 via the use of an input track 46. At this point, a compressible film input station 52 receives a supply of compressible film 22 of a certain predefined size, and then picks up and places them onto the carriers 10 to cover the substrates 16 and devices to be bonded to the substrates 16. An onloader 50 then feeds the carriers 10 into one of a plurality of sintering presses 54 to conduct the sintering process as described in detail with reference to FIGS. 4A to 4D above.

After the devices in the form of semiconductor dies 18 and metallic sheets 20 have been bonded to the substrate 16 by way of sintering, the carriers 10 are moved from the sintering presses 54 to a cooling station 56 for cooling and curing, and the carriers 10 are then offloaded by an offloader 58. There may be more than one cooling station 56 deployed to improve throughput, in case there is a productivity bottleneck encountered at the cooling station 56. After cooling, the carriers 10 are moved via an output track 60 to a product output storage station 62, where the sintered products can then be collected and the compressible film 22 discarded.

The compressible film 22 is preferable made of expanded PTFE or expanded graphite (that has undergone heat and acid treatment), to form a highly fibrillated membrane that is expanded at a predetermined stretch ratio, which should be a high stretch ratio for expanding the PTFE. An expanded PTFE membrane can be described as a porous structure with significantly lower density than a similar unexpanded PTFE structure. It may have a specific gravity of 0.1-1.9 g/cm$^3$, and porosity of 25-96%. Small pore size of less than 1 micron results in up to 90% porosity, while large size pores of 1-6 micron can contribute to driving the porosity to at least 95%. One preferred expanded PTFE film has a density of 0.5-0.9 g/cm$^3$, and compressibility of 50-90%. The expanded PTFE film may comprise multiple separate conformable expanded PTFE layers, optionally with one or more rigid PTFE layers sandwiched in between. A thickness of the compressible film 22 as used in the preferred embodiment of the invention may be in the region of 0.1-3.0 mm. The expanded graphite film may have a density of 0.5-1.5 g/cm$^3$, and compressibility of 15-70%.

Although the compressible film 22 may be introduced as separate pieces of material as shown in FIG. 3E, it can also be introduced as a continuous film, so that waste material handling is simplified. The compressible film 22 may also comprise a single compressible layer, multiple layers, or can be made from a composite material including a compressible material adapted for covering the metallic sheets 20 and semiconductor dies 18.

It should be appreciated that the use of a compressible film 22 as described in the preferred embodiment of the invention allows the sintering of semiconductor dies 18 and metallic sheets 20 to be successfully completed in a one-step process. This would help to save costs, simplify the assembly process and increase yield. Furthermore, much greater variations of semiconductor dies 18 and metallic sheets 20 heights can be compensated in order to improve sintering quality.

A user is able to assign specific areas to selectively apply sintering pressure, which is not possible in the prior art. The compressible film 22 is a consumable which can be loaded onto the products in an automated process, before the products are loaded into a sinter press for pressure sintering. Electronics devices produced using the method described above show no delamination at the sintering interfaces of the devices and die shear strength tests conducted show that the bond strengths are high.

The invention described herein is susceptible to variations, modifications and/or additions other than those specifically described and it is to be understood that the invention includes all such variations, modifications and/or additions which fall within the spirit and scope of the above description.

The invention claimed is:

1. Sintering apparatus for simultaneously sintering an electronic device onto a substrate, and a metallic sheet onto the electronic device, the sintering apparatus comprising:
    a sinter tool; and
    a compressible film positionable onto the metallic sheet and the electronic device, the compressible film comprising a fibrillated membrane expanded at a predetermined stretch ratio to form a porous structure having a lower density than a similar membrane that is unexpanded;

wherein a thickness of the compressible film is greater than a height of the metallic sheet, and the compressible film is adapted to conform to a shape of the metallic sheet and the electronic device to simultaneously cover an exposed area of the metallic sheet and at least a part of an exposed area of the electronic device when the sinter tool applies a sintering force onto the compressible film during a sintering process, and wherein a volume of the compressible film is configured to change when the sintering force is applied onto the compressible film so as to apply a uniform sintering pressure distribution on the exposed areas of the metallic sheet and the electronic device, which are located at different heights.

2. Sintering apparatus as claimed in claim 1, wherein the sintering apparatus is adapted to receive a carrier on which at least one substrate is supportable during sintering, such carrier being configured to fit a piece of the compressible film for covering the metallic sheet and electronic device prior to conducting the sintering process.

3. Sintering apparatus as claimed in claim 2, further comprising a compressible film input station for placing the piece of compressible film onto the metallic sheet and electronic device supported by the carrier.

4. Sintering apparatus as claimed in claim 2, wherein the carrier has a plurality of pockets, each pocket being configured to hold a respective substrate, and having a through-hole through which a bottom sinter tool may be insertable for supporting the substrate.

5. Sintering apparatus as claimed in claim 1, wherein the thickness of the compressible film is sufficient to further cover the metallic sheet and an entire exposed area of the electronic device during the sintering process.

6. Sintering apparatus as claimed in claim 1, wherein the compressible material is adapted to conform to and cover a bottom surface and parts of the sidewalls of the sinter tool when the sinter tool is applying a sintering force onto it during the sintering process.

7. Sintering apparatus as claimed in claim 1, wherein the compressible film comprises expanded PTFE.

8. Sintering apparatus as claimed in claim 7, wherein the expanded PTFE has a density of 0.5 to 0.9 g/cm$^3$ and a compressibility of 50 to 90%.

9. Sintering apparatus as claimed in claim 8, wherein the expanded PTFE further has a specific gravity of 0.1 to 1.9 g/cm$^3$ and a porosity of 25 to 96%.

10. Sintering apparatus as claimed in claim 1, wherein the compressible film comprises expanded graphite film.

11. Sintering apparatus as claimed in claim 10, wherein the expanded graphite film has a density of 0.5 to 1.5 g/cm$^3$ and a compressibility of 15 to 70%.

12. Sintering apparatus as claimed in claim 1, wherein the compressible film comprises multiple separate conformable layers of compressible film.

* * * * *